United States Patent
Hoi et al.

(10) Patent No.: US 11,674,216 B2
(45) Date of Patent: Jun. 13, 2023

(54) METHODS AND APPARATUS FOR DEPOSITING ALUMINUM BY PHYSICAL VAPOR DEPOSITION (PVD) WITH CONTROLLED COOLING

(71) Applicant: APPLIED MATERIALS, INC., Santa Clara, CA (US)

(72) Inventors: Siew Kit Hoi, Singapore (SG); Yaoying Zhong, Singapore (SG); Xinxin Wang, Singapore (SG); Zheng Min Clarence Chong, Singapore (SG)

(73) Assignee: APPLIED MATERIALS, INC., Santa Clara, CA (US)

(*) Notice: Subject to any disclaimer, the term of this patent is extended or adjusted under 35 U.S.C. 154(b) by 287 days.

(21) Appl. No.: 15/930,636

(22) Filed: May 13, 2020

(65) Prior Publication Data
US 2021/0189545 A1 Jun. 24, 2021

Related U.S. Application Data

(60) Provisional application No. 62/953,206, filed on Dec. 24, 2019.

(51) Int. Cl.
C23C 14/06 (2006.01)
C23C 14/34 (2006.01)
C23C 14/54 (2006.01)

(52) U.S. Cl.
CPC .......... *C23C 14/06* (2013.01); *C23C 14/3435* (2013.01); *C23C 14/541* (2013.01)

(58) Field of Classification Search
None
See application file for complete search history.

(56) References Cited

U.S. PATENT DOCUMENTS

| | | |
|---|---|---|
| 5,300,307 A | 4/1994 | Frear et al. |
| 5,665,659 A | 9/1997 | Lee et al. |
| 5,807,760 A | 9/1998 | Buckfeller et al. |
| 2003/0022491 A1* | 1/2003 | Bae .................. H01L 21/76838 257/E21.582 |
| 2007/0227877 A1* | 10/2007 | Wang .................... C23C 14/088 204/192.1 |
| 2009/0050468 A1 | 2/2009 | Allen et al. |
| 2015/0200166 A1* | 7/2015 | Kono .................... H01L 23/562 257/529 |
| 2017/0114448 A1* | 4/2017 | Mullapudi ............ C23C 14/352 |
| 2018/0025895 A1* | 1/2018 | Riker ................ H01J 37/32082 204/192.13 |

FOREIGN PATENT DOCUMENTS

KR    100318308 B1    4/2002

OTHER PUBLICATIONS

International Search Report for PCT/US2020/065658, dated Mar. 18, 2021.

* cited by examiner

*Primary Examiner* — Binh X Tran
*Assistant Examiner* — Bradford M Gates
(74) *Attorney, Agent, or Firm* — Moser Taboada

(57) ABSTRACT

Methods and apparatus for performing physical vapor deposition in a reactor chamber to form aluminum material on a substrate including: depositing a first aluminum layer atop a substrate to form a first aluminum region having a first grain size and a first temperature; and cooling the first aluminum region atop a substrate to a second temperature at a rate sufficient to increase the first grain size to a second grain size.

18 Claims, 6 Drawing Sheets

METHODS AND APPARATUS FOR DEPOSITING ALUMINUM BY PHYSICAL VAPOR DEPOSITION (PVD) WITH CONTROLLED COOLING

CROSS-REFERENCE TO RELATED APPLICATIONS

This application claims benefit of U.S. provisional patent application Ser. No. 62/953,206, filed Dec. 24, 2019 which is herein incorporated by reference in its entirety.

FIELD

Embodiments of the present disclosure generally relate to substrate processing techniques, and, more specifically, to methods of depositing aluminum during a PVD process.

BACKGROUND

In semiconductor devices, such as integrated circuits, interconnections are used to connect and integrate the various components of the device. Typically, the devices are composed of many layers of conductive components, separated by an insulating material to help minimize signal paths and reduce the size of the device. To establish continuity between the layers, a conductive interconnection (contact or via) extends between the insulating layers and connects the conductive layers. Thus, an interconnection is a vertical opening filled with conductive material used to connect components on various layers of a device to one another and to the semiconducting substrate.

As the integration of semiconductor devices increases, the sizes of interconnections have been reduced and their aspect ratios (i.e., the ratio of the height of the interconnection to the width) have increased. As a result, methods that in the past were sufficient to fill the interconnections have proved insufficient for the smaller interconnections. Typically, interconnection apertures are filled using a metal material, such as copper, that is deposited inside the apertures by chemical vapor deposition (CVD), physical vapor deposition (PVD), electroplating, or a combination thereof.

Interconnects in integrated circuits (ICs) distribute clock and other signals and provide power/ground to various parts within the circuit. With the continued scaling down of IC feature sizes, interconnects are becoming the dominant factor in determining system performance, e.g. signal propagation delays, and power dissipation, which relate to interconnect line resistance. Over the past 20 years, copper (Cu) has been the material of choice for interconnects because of the low resistivity of Cu. However, the inventors have observed copper can problematically interact with silicon at low temperatures or diffuse into surrounding dielectrics. A barrier layer is usually needed to prevent the diffusion, which will detrimentally contribute to the overall resistivity of the Cu. The inventors have observed a need to find a replacement material for copper in IC interconnects.

Further, while aluminum has been used to fill and cover features using long deposition chambers in interconnects, aluminum coverage of a feature and adjacent field is poor as long deposition chamber deposits problematically lack uniform aluminum coverage. The inventors have observed poor aluminum coverage performance lowers the reliability of interconnects formed therefrom. The inventors have also observed that rapid cooling of aluminum deposited atop a semiconductor substrate is detrimental to film quality and problematically leads to: small grain size resulting in aluminum line breakage and poor yield; poor reflective index values detrimentally affecting downstream post deposition processing; silicon precipitation in aluminum-silicon (Al—Si) thin films leading to poor film roughness and precipitation; and increased stress with AC bias processing leading to high warpage.

Therefore, the inventors have provided improved methods for forming an aluminum material on a substrate, and methods of improving aluminum coverage of a feature such as a via.

SUMMARY

Embodiment of forming an aluminum material on a substrate and increasing coverage of an aluminum material are provided herein. In some embodiments, a method of performing physical vapor deposition in a reactor chamber to form aluminum material on a substrate includes: depositing a first aluminum layer atop a substrate to form a first aluminum region having a first grain size and a first temperature; and cooling the first aluminum region atop a substrate to a second temperature at a rate sufficient to increase the first grain size to a second grain size.

In some embodiments, the present disclosure relates to a method of performing physical vapor deposition in a reactor chamber on a substrate positioned on a workpiece support underlying an aluminum sputter target, the method including: maintaining a substrate at a first temperature of 200 to 400° C. and a first pressure below 10 mTorr atop a heated workpiece support; sputtering atoms from the aluminum sputter target by applying a first DC power of about 4 kW to 60 kW to the aluminum sputter target and a first AC target bias power of at least 600 W; maintaining reaction conditions for a duration sufficient to form a first layer of aluminum having a first grain size; delaying a cooling of substrate for a first duration; and cooling the first layer of aluminum to a second temperature at a rate sufficient to increase the first grain size to a second grain size.

In some embodiments, the present disclosure relates to a physical vapor depositing chamber including a reaction chamber configured for physical vapor depositing a first aluminum layer atop a substrate to form a first aluminum region having a first grain size and a first temperature; and cooling the first aluminum region atop a substrate to a second temperature at a rate sufficient to increase the first grain size to a second grain size.

In some embodiments, the present disclosure relates to a computer readable medium, having instructions stored thereon which, when executed, cause a physical vapor deposition reactor chamber to perform a method of physical vapor deposition in a reactor chamber to form aluminum material on a substrate including: depositing a first aluminum layer atop a substrate to form a first aluminum region having a first grain size and a first temperature; and cooling the first aluminum region atop a substrate to a second temperature at a rate sufficient to increase the first grain size to a second grain size.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
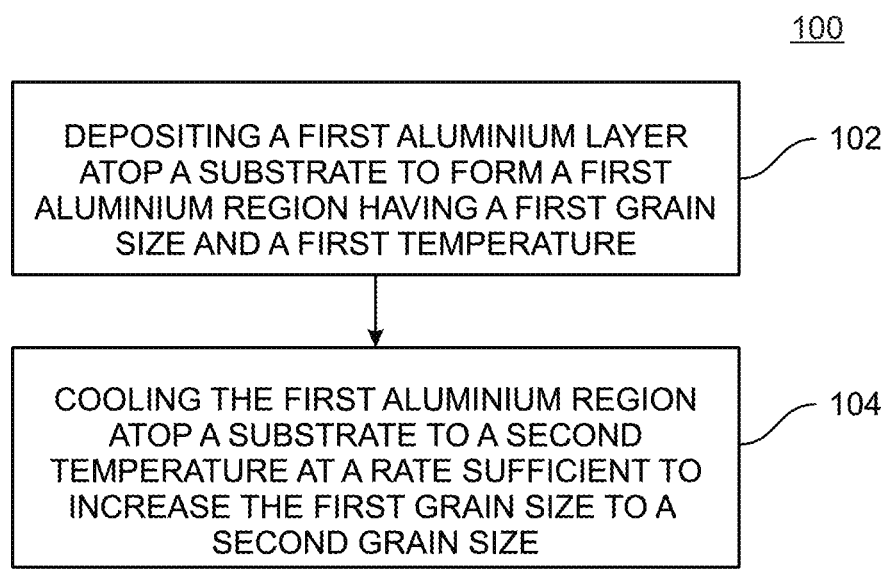
FIG. 1 depicts a flow chart of a method for processing a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of forming an aluminum material on a substrate are provided herein. The inventors have included aluminum in IC interconnects and improved the use and coverage of aluminum in interconnect structures by extending aluminum grain growth following deposition. In embodiments, a first event deposits aluminum having a smaller grain size compared to later measured grain size of the same material. By delaying and/or controlling post-deposition cool down of deposited aluminum, the grain growth period for aluminum is extended resulting in a larger aluminum grain size and improved aluminum film. In some embodiments, a method of performing physical vapor deposition in a reactor chamber to form aluminum material on a substrate includes: depositing a first aluminum layer atop a substrate to form a first aluminum region having a first grain size and a first temperature; and cooling the first aluminum region atop a substrate to a second temperature at a rate sufficient to increase the first grain size to a second grain size.

Embodiments of the methods may advantageously provide continuous coverage of surfaces of a substrate e.g., a high aspect ratio feature with aluminum materials having improved coverage and/or low resistivity. Embodiments, of the present disclosure, by starting with a small grain size, extend the grain growth period of aluminum post deposition to advantageously provide continuous coverage of substrate surfaces. In some embodiments, by starting with a small grain size and ending with a larger grain size, more grain coalescence events occur during aluminum film grown, improving aluminum mobility, enhancing aluminum coverage, and preventing line breakage. In some embodiments, downstream post deposition processes are improved as reflective index values of the deposited aluminum films are improved. In some embodiments, film roughness is reduced and precipitation of silicon is avoided. In some embodiments, film stress is reduced lowering warpage. In embodiments, aluminum film quality is improved by delaying rapid cooling of deposited aluminum. In some embodiments, the grain size may be enlarged during an aluminum deposition process and post deposition process sequence as described herein to resolve aluminum pad abnormalities after downstream thermal processing and/or avoid hillock formation.

FIG. 1 depicts a flow chart of a method 100 for forming an aluminum material on a substrate 200 in accordance with some embodiments of the present disclosure. Although the method 100 is described below with respect to the stages of filling a high aspect ratio feature as depicted in FIGS. 2A-2D, the disclosure provided herein can be used to deposit an aluminum material as a sheet or blanket upon or atop a substrate, e.g., without having features such as a high aspect ratio feature. In addition, the disclosure provided herein can also be used to fill features having other aspect ratios other than a high aspect ratio. In some embodiments, aluminum material may be formed as a sheet or blanket on a substrate and subjected to additional process flows such as etching, filling and/or capping. The method 100 may be performed in any suitable PVD process chamber having DC, AC, and/or radio frequency (RF) power sources, such as a process chamber 300 described below and depicted in FIG. 3.

In embodiments, the method 100 of FIG. 1 begins at 102 by depositing a first aluminum layer atop a substrate to form a first aluminum region having a first grain size and a first temperature. In embodiments, by delaying cooling of the substrate and first aluminum layer, the grain growth period for aluminum deposition is extended.

Figure 2A:
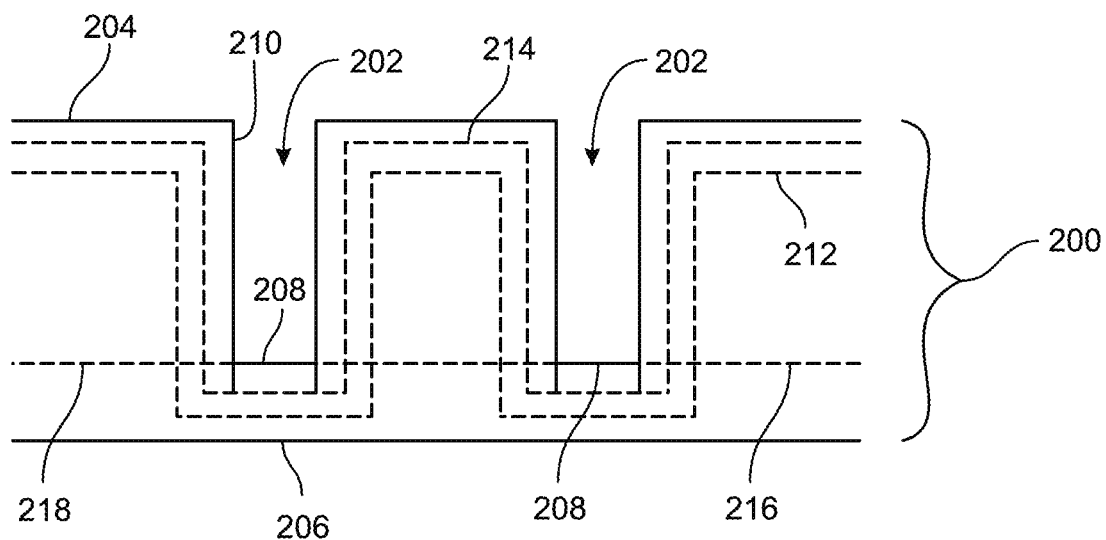
FIGS. 2A-D depicts the stages of filling a high aspect ratio opening in accordance with some embodiments of the present disclosure.

Referring to FIG. 2A, a substrate 200 may be provided to a PVD chamber, such as process chamber 300. In embodiments, the substrate 200 includes a high aspect ratio opening such as opening 202 formed in a first surface 204 of the substrate 200 and extending into the substrate 200 towards an opposing second surface 206 of the substrate 200. The substrate 200 may be any suitable substrate including, but not limited to a substrate having a high aspect ratio opening formed thereon. For example, the substrate 200 may comprise one or more of silicon (Si), ($SiO_2$), (SiN), or other dielectric materials. In embodiments, the substrate may optionally comprise a thin metal layer such as TiN tantalum nitride (TaN), or others. In addition, the substrate 200 may optionally include additional layers of materials or may have one or more completed or partially completed structures formed therein or thereon.

In some embodiments, the opening 202 may be any opening having a high aspect ratio, such as used to form a via, trench, dual damascene structure, or the like. In some embodiments, the opening 202 may have a height to width aspect ratio of at least about 5:1 (e.g., a high aspect ratio). For example, in some embodiments, the aspect ratio may be about 10:1 or greater, such as about 15:1, or more. The opening 202 may be formed by etching the substrate using any suitable etch process. The opening 202 includes a bottom surface 208 and sidewalls 210 as shown.

In some embodiments, the bottom surface 208 and the sidewalls 210 may optionally be covered with one or more layers prior to depositing aluminum atoms as described below. For example, and as shown by dotted lines in FIG. 2A, the bottom surface and sidewalls of the opening 202 and the first surface of the substrate 200 may be covered by a dielectric layer or an oxide layer 212, such as silicon oxide (SiO$_2$), (Si), (SiN), or other dielectric materials. The oxide layer may be deposited or grown, for example in a chemical vapor deposition (CVD) chamber or in an oxidation chamber, prior to providing the substrate 200 to a PVD chamber. A dielectric layer or an oxide layer 212 may serve as an electrical and/or physical barrier between the substrate and an aluminum-containing layer to be subsequently deposited in the opening, and/or may function as a better surface for attachment during the deposition process discussed below than a native surface of the substrate. In embodiments, materials other than oxides may be substituted for oxide layer 212.

In some embodiments, a barrier layer 214 may optionally be deposited atop the oxide layer 212 (as shown), or atop a dielectric layer, or atop the bottom surface and sidewalls of the opening and the first surface of the substrate if an oxide layer is not present. The barrier layer 214 may serve a similar purpose as either a dielectric layer or the oxide layer 212 discussed above. In some embodiments, the barrier layer 214 may include at least one of titanium (Ti), titanium nitride (TiN), tantalum (Ta), tantalum nitride (TaN), or others. The barrier layer 214 may be deposited by any suitable methods, such as by CVD or PVD, including by using the method 100 described below to form a continuous barrier layer in the opening 202.

In some embodiments, the opening 202 may extend completely through the substrate 200 and a surface 216 of a second substrate 218 may form the bottom surface 208 of the opening 202. The second substrate 218 may be disposed adjacent to the second surface 206 of the substrate 200. In embodiments, a device, such as a logic device or the like, or a portion of a device requiring electrical connectivity, such as a gate, a contact pad, a conductive via, or the like, may be disposed in the surface 216 of a second substrate and aligned with the opening 202.

At 102, the deposition of an aluminum layer atop a substrate 200 may occur in a PVD chamber (FIG. 3) where a first DC power of about 4 kilowatt (kW) to 60 kW is applied to an aluminum sputter target to form a plasma from a plasma-forming gas and a first AC target bias power of at least 600 W may be applied, for example to a pedestal including a substrate or workpiece. In some embodiments, the target may be the target 306 comprising or consisting of aluminum. Further, the target may comprise one or more of aluminum alloys, such as pure aluminum including 0.5% copper, or pure aluminum including 0.5% silicon, or the like, suitable for forming a first aluminum layer 220 on the surfaces of the opening 202 and the first surface 204 of the substrate 200. Other constituents such as metals may be present in an amount of less than 1% weight of the total target weight such as titanium (Ti), tantalum (Ta), copper (Cu), or the like. The plasma-forming gas may include an inert gas, such as a noble gas, or other inert gas. For example, non-limiting examples of suitable plasma-forming gases may include argon (Ar), helium (He), xenon (Xe), neon (Ne), or the like. In embodiments, the plasma-forming gas such as a process gas is argon (Ar) having a flow rate of about 50 to 350 sccm. In one embodiment the plasma-forming gas is argon (Ar) having a flow rate of about 70 sccm.

Figure 2B:
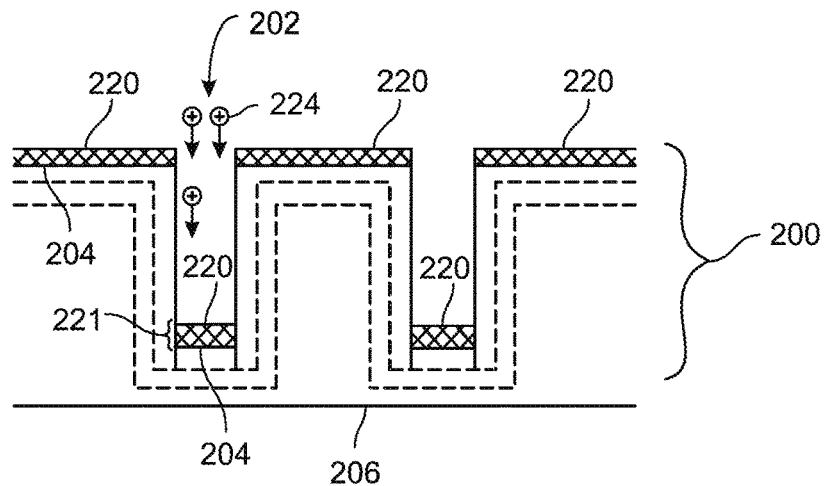

At 102, the deposition of a first aluminum layer 220 atop a substrate 200 (as shown in FIG. 2B) may occur in a PVD chamber where RF power may optionally be applied at a VHF frequency for one or more of forming the plasma from the plasma-forming gas and ionizing metal atoms sputtered from the target by the plasma. As used herein, a VHF frequency is a frequency in the range of from about 13 MHz to about 100 MHz such as 13.56 MHz. In some embodiments, the VHF frequency applied is about 60 MHz. For example, increasing the VHF frequency may increase the plasma density. In some embodiments, RF power may be applied at a 0.5 to 3 kW, such as 1 kW, 1.25 kW, 2.5 kW, or 3 kW.

At 102, the deposition of a first aluminum layer atop a substrate 200 may occur in a PVD chamber where a DC power may be applied to the target 306 to direct the plasma towards the target 306, for example, from a DC power source 320 coupled to the target 306 as described below. The DC power may initially range from about 1 to about 60 kilowatts (kW). In some embodiments, the DC power may be about 10-50 kW, or approximately 20 kW, 30 kW, or 40 kW. The DC power may be adjusted to control the deposition rate of sputtered aluminum atoms on the substrate 200. In embodiments, the DC power under conditions of the present disclosure can result in a first aluminum layer 220 atop the substrate forming a first aluminum region 221 having a first grain size, wherein the grain size may be made smaller in size. By reducing the initial grain size during aluminum deposition, the grain growth period may be extended. In some embodiments, depositing a first aluminum layer 220 atop a substrate 200 to form a first aluminum region 221 having a first grain size and a first temperature, wherein the first temperature is about 200 to 400 degrees Celsius.

At 102, the deposition of a first aluminum layer atop a substrate 200 to form a first aluminum region 221 having a first grain size and a first temperature may occur in a PVD chamber where, aluminum atoms are sputtered from the target 306 using the plasma while maintaining a first pressure in the PVD chamber. The first pressure, in addition to the first AC power and the DC power applied, may be dependent on process chamber geometry (such as substrate size, target to substrate distance, and the like). For example, the first pressure may be less than 10 millitorr (mTorr) or in a range from about 0.2 to about 10 (mTorr) in a chamber configured with a target. In embodiments, the chamber may optionally be configured with a target to substrate gap of about 35 to 90 millimeters (mm). In some embodiments, the first pressure is about 0.5 to about 5 mTorr, or 2 mTorr. The first pressure in the chamber may be maintained by the flow rate of the plasma-forming gas and/or the flow rate of an additional gas, such as an inert gas, which may be co-flowed with the plasma-forming gas. The first pressure may provide a high density of gas molecules between the target and the substrate with which sputtered aluminum atoms may collide and be ionized. Pressure may be additionally utilized to control the amount of aluminum atoms sputtered from the target 306. For example, low pressure in the target 306 to substrate gap may reduce the grain size of the first aluminum layer 220.

At 102, in one embodiment, the deposition of a first aluminum layer 220 atop a substrate 200 to form a first aluminum region 221 having a first grain size and a first temperature may occur in a PVD chamber under argon (Ar) plasma, at a flow of about 50 to 350 sccm such as 70 sccm, having a process pressure of less than 10 mTorr, at power of 1-60 kW DC or about 600 to 1200 W AC such as RF applied as a bias power to a substrate support pedestal. In embodiments, the temperature is below 350 degrees Celsius. At 102, in one embodiment, the deposition of a first aluminum layer 220 atop a substrate 200 may occur in a PVD chamber under Ar plasma, at a temperature below 350 degrees Celsius, having a process pressure of less than 10 mTorr, at power of 4-60 kW DC, and large AC bias at 600 W to 1200 W. In embodiments, the first aluminum layer 220 forms a region as defined by the first aluminum layer 220 where the grain size is characterized as small, for example about 2 micrometer or less.

In some embodiments, at 102, the deposition of a first aluminum layer 220 atop a substrate 200 to form a first aluminum region 221 having a first grain size and a first temperature may occur in a PVD chamber while maintaining a substrate at a first temperature of 200 to 400° C. and a first pressure below 10 mTorr atop a heated workpiece support while sputtering atoms from the aluminum sputter target by applying a first DC power of about 4 kW to 60 kW to the aluminum sputter target and a first AC target bias power of at least 600 W.

Figure 2C:
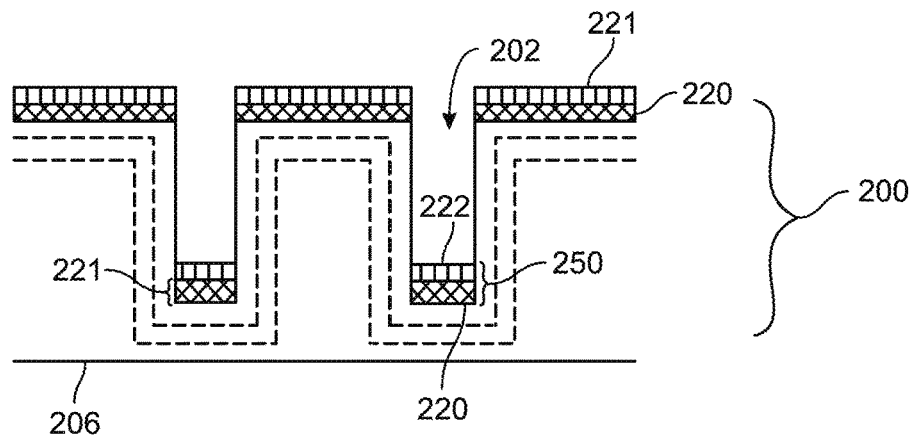

In embodiments, the reaction conditions are maintained for a duration sufficient to form a first layer of aluminum having a first grain size, and optionally a second layer of aluminum having a second grain size larger than the first grain size. Referring to FIG. 2C, an optional second aluminum layer 222 having a top surface 225 is shown adjacent the first aluminum layer 220 atop first surface 204. In some embodiments, as the deposition of aluminum proceeds, the aluminum grain size gradually gets larger through a transition or transition phase.

In some embodiments, at 102, the deposition of a first aluminum layer 220 atop a substrate 200 to form a first aluminum region 221 having a first grain size and a first temperature may occur in a PVD chamber where a first plurality of aluminum atoms 224 are deposited on the first surface 204 of the substrate 200 and on the bottom surface 208 of the opening 202 as illustrated in FIG. 2B. The first plurality of aluminum atoms 224 may be deposited using the processing conditions discussed above, such as the first temperature, first pressure, first AC or RF power, and DC power to sputter aluminum atoms 224 approximately perpendicular to substrate 200 as illustrated in FIG. 2B. In some embodiments, an AC power may be applied to the substrate 200 (e.g., to an electrode disposed beneath the substrate 200, such as within the substrate support) during the deposition of the first plurality of aluminum atoms 224. The AC power (such as an RF bias power) may be applied at a frequency ranging from about 0.5 to about 13.56 MHz and at a power of up 1200 W or about 600 W to 1200 W. In some embodiments, RF bias power may be applied at a 0.5 to 3 kW, such as 1 kW, 1.25 kW, 2.5 kW, or 3 kW. In embodiments, increasing AC bias power promotes attraction of positive ions bombarding a substrate surface inhibiting coalescence and inhibiting aluminum grain growth, leading to the formation of relatively small Al grains in the first aluminum layer.

In some embodiments, a first RF bias power and a second RF bias power (such as an RF bias power) may be used utilized concurrently, the first RF bias power may be used to control ion energy proximate the substrate 200 and a second RF bias power may be used to control a distribution in the ion energy proximate the substrate 200.

In some embodiments, at 102, the temperature for depositing the aluminum layer may be 200 to 400 degrees Celsius, such as, e.g., 100 to 250 degrees Celsius. In some embodiments, at 102, the first aluminum layer 220 is formed to a predetermined thickness. In embodiments, the thickness of the first aluminum layer 220 and first aluminum region 221 is about 1-5 micrometer such as 1 micrometer, or 1.5 micrometer. In embodiments, after deposition of about 1.5 micrometers of aluminum, grain growth may accelerate.

Referring back to FIG. 1, at 104, in embodiments, e.g., subsequent to the formation of a first aluminum layer atop a substrate to form a first aluminum region 221 having a first grain size, the first aluminum region 221 atop a substrate 200 is cooled to a second temperature at a rate sufficient to increase the first grain size to a second grain size. In some embodiments, cooling comprises delaying cooling for a first duration. For example, after deposition, the process may pause for a duration such as 4 seconds to 120 seconds to cool the substrate and deposited aluminum. In some embodiments, the first duration is about 5 to 120 seconds. In some embodiments, cooling is performed at a cooling rate of 10 to 40 degrees Celsius per second such as about 20 degrees Celsius per second. In some embodiments, the first temperature is greater than 375 to 450 degrees Celsius and the second temperature is less than 100 degrees Celsius. In some embodiments, cooling is performed by moving the substrate away from the heated surface. In some embodiments, cooling comprises delaying a transfer of the first aluminum region atop a substrate to a rapid cooling chamber. In some embodiments, cooling the first aluminum region atop a substrate to a second temperature at a rate sufficient to increase the first grain size to a second grain size further comprises increasing a flow of gas adjacent a backside of a substrate to cool the substrate.

In some embodiments, at 104, the temperature for cooling is at a temperature below the first temperature. In some embodiments, cooling lowers the temperature of the substrate from about 375 to 450 degrees Celsius to about 100 degrees Celsius.

In some embodiments, subsequent to cooling, additional aluminum material 250 may be deposited and formed to a predetermined thickness. In embodiments, the aluminum material 250 (FIG. 2D) has a thickness of about 1-5 micrometers such as 1 micrometer, or 3 micrometers. In embodiments, the additional aluminum material is subjected to cooling in accordance with the present disclosure. In some embodiments, the additional aluminum material is subjected to a delay in cooling in accordance with the present disclosure.

In some embodiments, after the aluminum material 250 is formed, the method 100 may end, or the substrate 200 may continue for further processing. An example of further processing optionally includes annealing the substrate 200. In some embodiments, annealing is characterized as ex situ. In embodiments, the anneal may be performed at a temperature of about 500 to 700 degrees Celsius, such as 550 degrees Celsius, for about 10 minutes, at a pressure of about 20 bar. In embodiments, an anneal may be performed in, e.g., an annealing chamber.

Figure 2D:
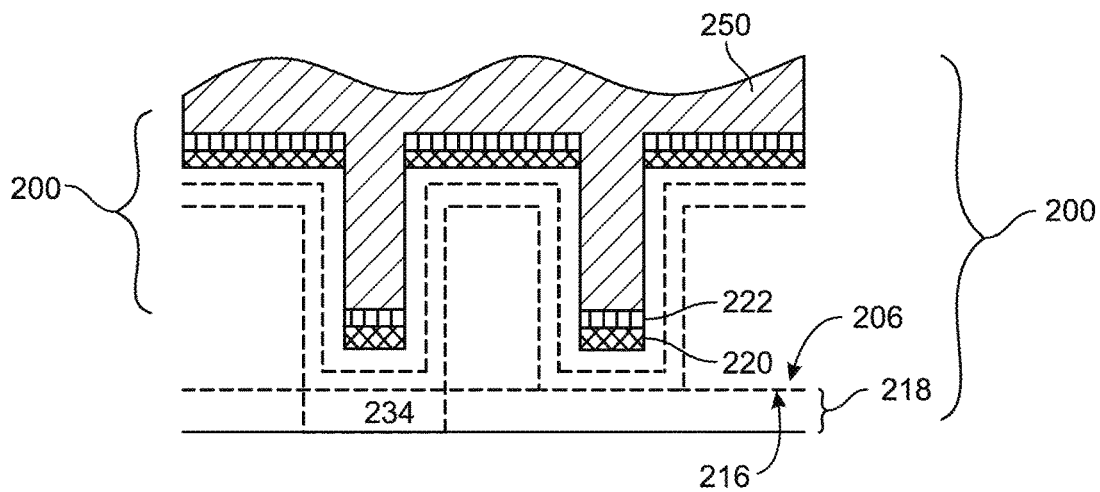

Referring to FIG. 2D, in some embodiments, a second substrate 218 may have been provided prior to performing 102-104 described above. Accordingly, as illustrated in FIG. 2D, the second substrate 218 may be disposed adjacent to the second surface 206 of the substrate 200, where the opening 202 extends completely through the substrate 200 and the surface 216 of the second substrate 218 forms the bottom surface of the opening 202. Further, a device or conductive feature 234 may be disposed in the second substrate and exposed at the surface 216, wherein the device or conductive feature 234 is aligned with the opening 202. The first surface 204 of the substrate 200 may be further processed to remove deposited aluminum atoms. For example, a chemical mechanical polishing technique, etching, or the like may be used to remove deposited aluminum atoms from the first surface 204, as illustrated in FIG. 2D.

Figure 3:
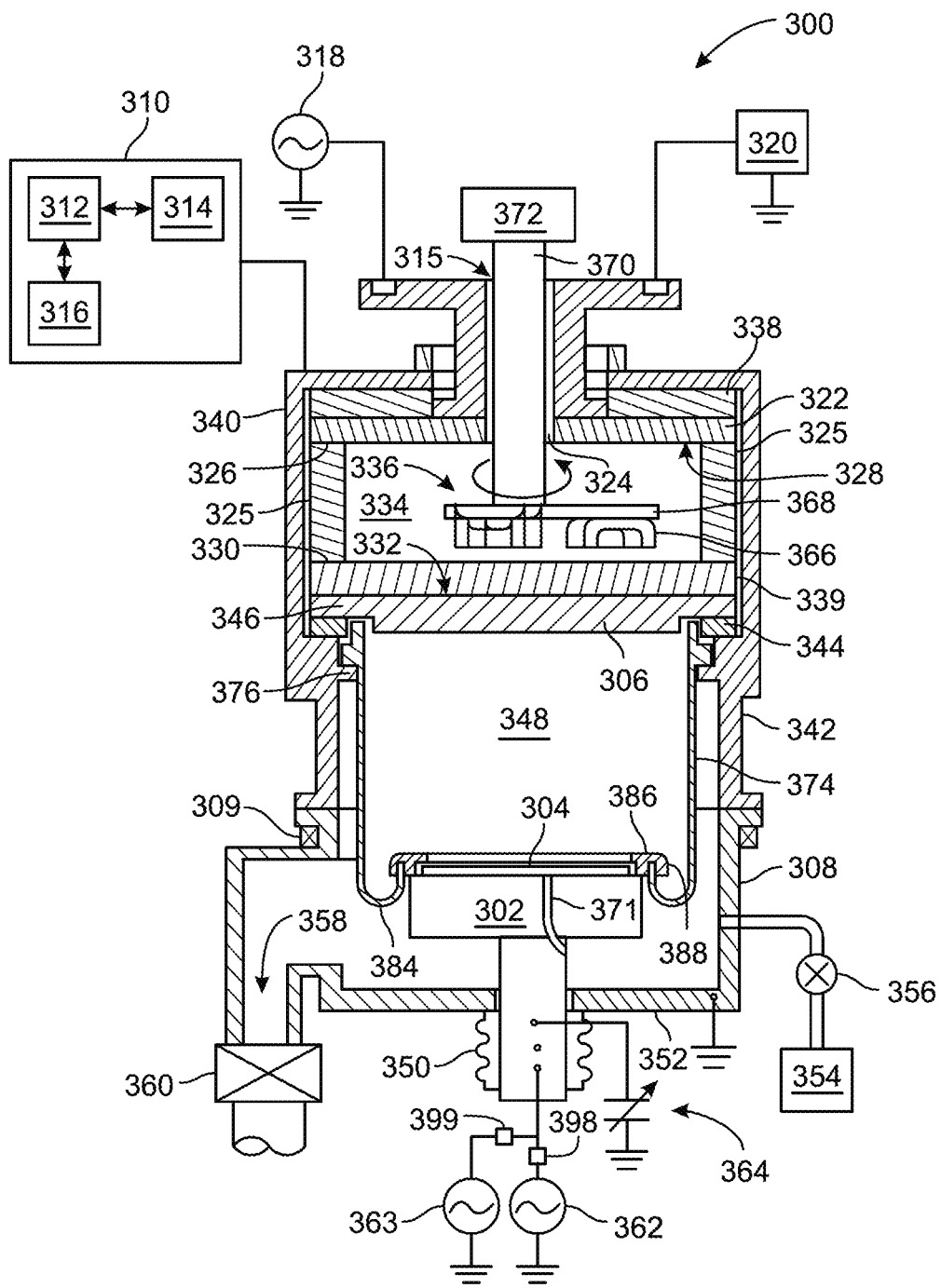
FIG. 3 depicts a schematic, cross-sectional view of a physical vapor deposition (PVD) chamber in accordance with some embodiments of the present disclosure.

FIG. 3 depicts a schematic, cross-sectional view of a physical vapor deposition chamber (process chamber 300) in accordance with some embodiments of the present disclosure. Examples of suitable PVD chambers include the EXECTA™ AL PVD process chambers, commercially available from Applied Materials, Inc., of Santa Clara, Calif. Other process chambers from Applied Materials, Inc. or other manufactures may also benefit from the apparatus disclosed herein.

The process chamber 300 contains a substrate support pedestal 302 for receiving a substrate 304 such as a workpiece thereon, and a sputtering source, such as a target 306. The substrate support pedestal 302 may be located within a grounded chamber wall 308, which may be a chamber wall (as shown) or a grounded shield (a ground shield 340 is shown covering at least some portions of the process chamber 300 above the target 306. In some embodiments, the ground shield 340 could be extended below the target to enclose the pedestal 302 as well).

In some embodiments, the process chamber includes a feed structure for coupling RF and DC energy to the target 306. The feed structure is an apparatus for coupling RF and DC energy to the target, or to an assembly containing the target, for example, as described herein. A first end of the feed structure can be coupled to an optional RF power source 318 and a DC power source 320, which can be respectively utilized to provide RF and DC energy to the target 306. For example, the DC power source 320 may be utilized to apply a negative voltage, or bias, to the target 306. In some embodiments, RF energy optionally supplied by the RF power source 318 may be suitable to provide frequency as described above, or range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may optionally be provided (i.e., two or more) to provide RF energy in a plurality of the above frequencies. The feed structure may be fabricated from suitable conductive materials to conduct the RF and DC energy from the RF power source 318 and the DC power source 320. In embodiments, RF power source 318 is excluded, and DC power source 320 is configured to apply a negative voltage, or bias, to the target 306.

In some embodiments, the feed structure may have a suitable length that facilitates substantially uniform distribution of the respective RF and DC energy about the perimeter of the feed structure. For example, in some embodiments, the feed structure may have a length of between about 1 to about 12 inches, or about 4 inches. In some embodiments, the body may have a length to inner diameter ratio of at least about 1:1. Providing a ratio of at least 1:1 or longer provides for more uniform RF delivery from the feed structure (i.e., the RF energy is more uniformly distributed about the feed structure to approximate RF coupling to the true center point of the feed structure. The inner diameter of the feed structure may be as small as possible, for example, from about 1 inch to about 6 inches, or about 4 inches in diameter. Providing a smaller inner diameter facilitates improving the length to ID ratio without increasing the length of the feed structure.

The second end of the feed structure may be coupled to a source distribution plate 322. The source distribution plate includes a hole 324 disposed through the source distribution plate 322 and aligned with a central opening of the feed structure. The source distribution plate 322 may be fabricated from suitable conductive materials to conduct the RF and DC energy from the feed structure.

The source distribution plate 322 may be coupled to the target 306 via a conductive member 325. The conductive member 125 may be a tubular member having a first end 326 coupled to a target-facing surface 328 of the source distribution plate 322 proximate the peripheral edge of the source distribution plate 322. The conductive member 325 further includes a second end 330 coupled to a source distribution plate-facing surface 332 of the target 306 (or to the backing plate 346 of the target 306) proximate the peripheral edge of the target 306.

A cavity 334 may be defined by the inner-facing walls of the conductive member 325, the target-facing surface 328 of the source distribution plate 322 and the source distribution plate-facing surface 332 of the target 306. The cavity 334 is fluidly coupled to the central opening 315 of the body via the hole 324 of the source distribution plate 322. The cavity 334 and the central opening 315 of the body may be utilized to at least partially house one or more portions of a rotatable magnetron assembly 336 as illustrated in FIG. 3 and described further below. In some embodiments, the cavity may be at least partially filled with a cooling fluid, such as water ($H_2O$) or the like.

A ground shield 340 may be provided to cover the outside surfaces of the lid of the process chamber 300. The ground shield 340 may be coupled to ground, for example, via the ground connection of the chamber body. The ground shield 340 has a central opening to allow the feed structure to pass through the ground shield 340 to be coupled to the source distribution plate 322. The ground shield 340 may comprise any suitable conductive material, such as aluminum, copper, or the like. An insulative gap 339 is provided between the ground shield 340 and the outer surfaces of the source distribution plate 322, the conductive member 325, and the target 306 (and/or backing plate 346) to prevent the RF and DC energy from being routed directly to ground. The insulative gap may be filled with air or some other suitable dielectric material, such as a ceramic, a plastic, or the like.

In some embodiments, a ground collar may be disposed about the body and lower portion of the feed structure. The ground collar is coupled to the ground shield 340 and may be an integral part of the ground shield 340 or a separate part coupled to the ground shield to provide grounding of the feed structure. The ground collar may be made from a suitable conductive material, such as aluminum or copper. In some embodiments, a gap disposed between the inner diameter of the ground collar and the outer diameter of the body of the feed structure may be kept to a minimum and be just enough to provide electrical isolation. The gap can be filled with isolating material like plastic or ceramic or can be an air gap. The ground collar prevents cross-talk between the RF feed (e.g., electrical feed 205, discussed below) and the body, thus improving plasma, and processing, uniformity.

An isolator plate 338 may be disposed between the source distribution plate 322 and the ground shield 340 to prevent the RF and DC energy from being routed directly to ground. The isolator plate 338 has a central opening to allow the feed structure to pass through the isolator plate 338 and be coupled to the source distribution plate 322. The isolator plate 338 may comprise a suitable dielectric material, such as a ceramic, a plastic, or the like. Alternatively, an air gap may be provided in place of the isolator plate 338. In embodiments where an air gap is provided in place of the isolator plate, the ground shield 340 may be structurally sound enough to support any components resting upon the ground shield 340.

The target 306 may be supported on a grounded conductive aluminum adapter such as 342 through a dielectric isolator 344. The target 306 comprises a material to be deposited on the substrate 304 during sputtering, such aluminum, or aluminum alloy. In some embodiments, the backing plate 346 may be coupled to the source distribution plate-facing surface 332 of the target 306. The backing plate 346 may comprise a conductive material, such as aluminum, or the same material as the target, such that RF and DC power can be coupled to the target 306 via the backing plate 346. Alternatively, the backing plate 346 may be non-conductive and may include conductive elements (not shown) such as electrical feedthroughs or the like for coupling the source distribution plate-facing surface 332 of the target 306 to the second end 330 of the conductive member 325. The backing plate 346 may be included for example, to improve structural stability of the target 306.

The substrate support pedestal 302 has a material-receiving surface facing the principal surface of the target 306 and supports the substrate 304 to be sputter coated in planar position opposite to the principal surface of the target 306. The substrate support pedestal 302 may support the substrate 304 in a central region 348 of the process chamber 300. The central region 348 is defined as the region above the substrate support pedestal 302 during processing (for example, between the target 306 and the substrate support pedestal 302 when in a processing position).

In some embodiments, the substrate support pedestal 302 may be vertically movable through a bellows 350 connected to a bottom chamber wall 352 to allow the substrate 304 to be transferred onto the substrate support pedestal 302 through a load lock valve (not shown) in the lower portion of processing the process chamber 300 and thereafter raised to a deposition, or processing position. One or more processing gases may be supplied from a gas source 354 through a mass flow controller 356 into the lower part of the process chamber 300. An exhaust port 358 may be provided and coupled to a pump (not shown) via a valve 360 for exhausting the interior of the process chamber 300 and facilitating maintaining a desired pressure inside the process chamber 300.

In some embodiments, substrate support pedestal includes an air passage 371 for providing a back-side gas to substrate 304. In embodiments, closing air passage 371 and restricting the flow of back-side gas applied to a substrate 304 will increase the temperature of the substrate 304.

In some embodiments, an RF bias power source 362 may optionally be coupled to the substrate support pedestal 302 in order to induce a negative DC bias on the substrate 304. In addition, in some embodiments, a negative DC self-bias may form on the substrate 304 during processing. For example, RF power supplied by the RF bias power source 362 may range in frequency from about 2 MHz to about 60 MHz, for example, non-limiting frequencies such as 2 MHz, 13.56 MHz, or 60 MHz can be used. Further, a second RF bias power source 363 may be coupled to the substrate support pedestal 302 and provide any of the frequencies discussed above for use alone or optionally with the RF bias power source 362. In embodiments, a tuning network 399 may be positioned between second RF bias power source 363 and the substrate support pedestal. In embodiments, a second tuning network 398 may be positioned between RF bias power source 362 and the substrate support pedestal. In embodiments, second RF bias power source 363 is configured to provide the AC bias power to lower ion energy resulting in aluminum coalescing with the second layer of aluminum having a second grain size to increase the second grain size. In other applications, the substrate support pedestal 302 may be grounded or left electrically floating. For example, a capacitance tuner 364 may be coupled to the substrate support pedestal for adjusting voltage on the substrate 304 for applications where RF bias power may not be desired.

A rotatable magnetron assembly 336 may be positioned proximate a back surface (e.g., source distribution plate-facing surface 332) of the target 306. The rotatable magnetron assembly 336 includes a plurality of magnets 366 supported by a base plate 368. The base plate 368 connects to a rotation shaft 370 coincident with the central axis of the process chamber 300 and the substrate 304. A motor 372 can be coupled to the upper end of the rotation shaft 370 to drive rotation of the magnetron assembly 336. The magnets 366 produce a magnetic field within the process chamber 300, generally parallel and close to the surface of the target 306 to trap electrons and increase the local plasma density, which in turn increases the sputtering rate. The magnets 366 produce an electromagnetic field around the top of the process chamber 300, and magnets 366 are rotated to rotate the electromagnetic field which influences the plasma density of the process to more uniformly sputter the target 306. For example, the rotation shaft 370 may make about 0 to about 150 rotations per minute.

In some embodiments, the process chamber 300 may further include a process kit shield 374 connected to a ledge 376 of the adapter 342. The adapter 342 in turn is sealed and grounded to the aluminum chamber sidewall such as chamber wall 308. Generally, the process kit shield 374 extends downwardly along the walls of the adapter 342 and the chamber wall 308 downwardly to below an upper surface of the substrate support pedestal 302 and returns upwardly until reaching an upper surface of the substrate support pedestal 302 (e.g., forming a u-shaped portion 384 at the bottom). Alternatively, the bottommost portion of the process kit shield need not be a u-shaped portion 384 and may have any suitable shape. A cover ring 386 rests on the top of an upwardly extending lip 388 of the process kit shield 374 when the substrate support pedestal 302 is in a lower, loading position but rests on the outer periphery of the substrate support pedestal 302 when the substrate support pedestal 302 is in an upper, deposition position to protect the substrate support pedestal 302 from sputter deposition. An additional deposition ring (not shown) may be used to shield the periphery of the substrate 304 from deposition. Embodiments of a process kit shield are discussed below in accordance with the present disclosure.

In some embodiments, a magnet 309 may be disposed about the process chamber 300 for selectively providing a magnetic field between the substrate support pedestal 302 and the target 306. For example, as shown in FIG. 3, the magnet 309 may be disposed about the outside of the chamber wall 308 in a region just above the substrate support pedestal 302 when in processing position. In some embodiments, the magnet 309 may be disposed additionally or alternatively in other locations, such as adjacent the adapter 342. The magnet 309 may be an electromagnet and may be coupled to a power source (not shown) for controlling the magnitude of the magnetic field generated by the electromagnet.

A controller 310 may be provided and coupled to various components of the process chamber 300 to control the operation thereof. The controller 310 includes a central processing unit (CPU) 312, a memory 314, and support circuits 316. The controller 310 may control the process chamber 300 directly, or via computers (or controllers) associated with particular process chamber and/or support system components. The controller 310 may be one of any form of general-purpose computer processor that can be used in an industrial setting for controlling various chambers and sub-processors. The memory, or computer readable medium, 434 of the controller 310 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 316 are coupled to the CPU 312 for supporting the processor in a conventional manner. These circuits include cache, power supplies, clock circuits, input/output circuitry and subsystems, and the like. The methods as described herein may be stored in the memory 314 as software routine that may be executed or invoked to control the operation of the process chamber 300 in the manner described herein. The software routine may also be stored and/or executed by a second CPU (not shown) that is remotely located from the hardware being controlled by the CPU 312.

In embodiments, methods for depositing aluminum in high aspect ratio features formed on substrates have been provided herein. The methods advantageously provide excellent coverage of surfaces of the high aspect ratio feature with aluminum by extending the period of grain growth after aluminum is deposited. In some embodiments, the present disclosure provides a physical vapor depositing chamber including a reaction chamber configured for physical vapor depositing a first aluminum layer atop a substrate to form a first aluminum region having a first grain size and a first temperature; and cooling the first aluminum region atop a substrate to a second temperature at a rate sufficient to increase the first grain size to a second grain size. In some embodiments, the reaction chamber is configured to provide a flow of gas adjacent a backside of a substrate to cool the substrate. In some embodiments, cooling is performed by moving the substrate away from a heated surface.

In some embodiments, the present disclosure provides a computer readable medium, having instructions stored thereon which, when executed, cause a physical vapor deposition reactor chamber to perform a method of: depositing a first aluminum layer atop a substrate to form a first aluminum region having a first grain size and a first temperature; and cooling the first aluminum region atop a substrate to a second temperature at a rate sufficient to increase the first grain size to a second grain size.

Figure 4:
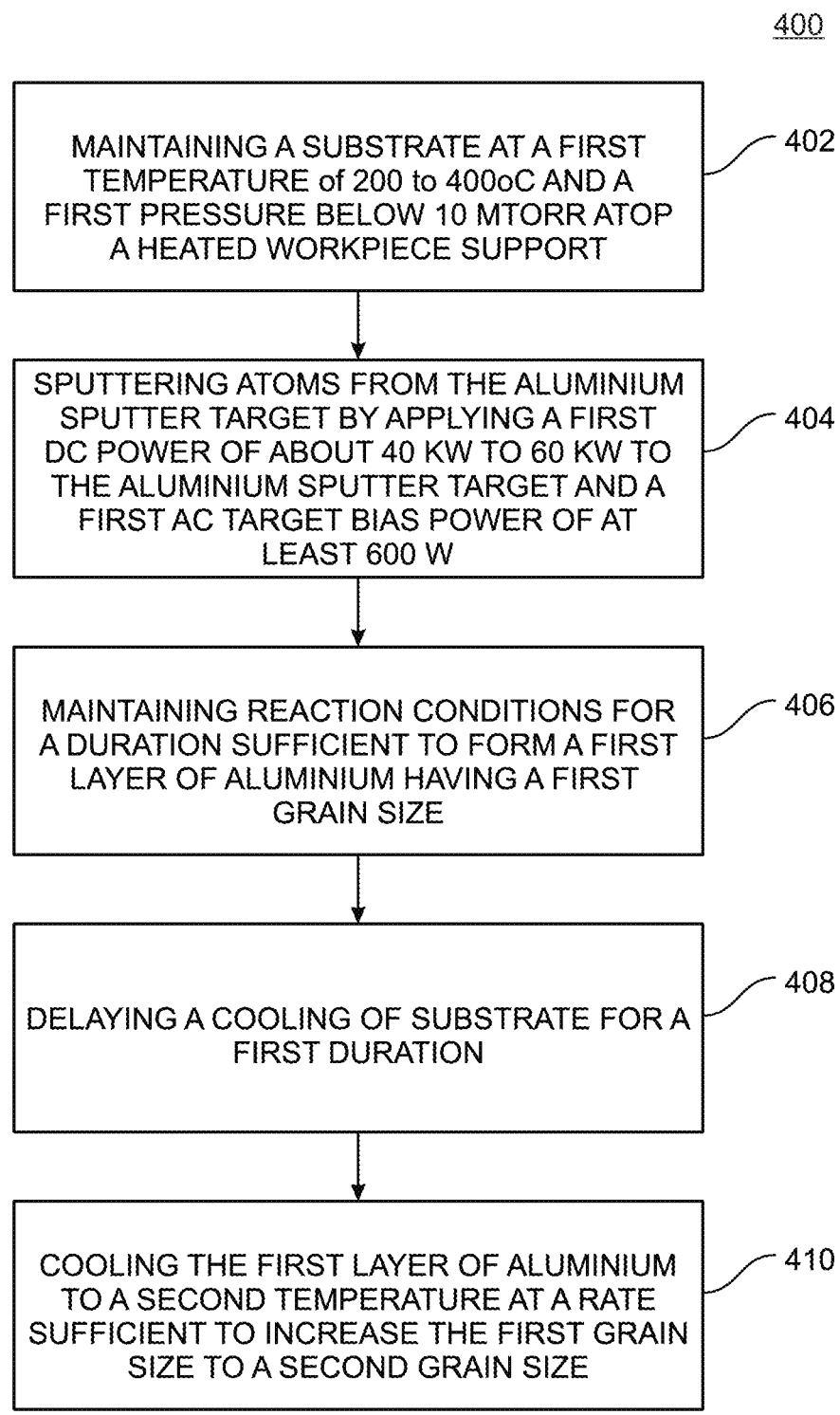
FIG. 4 depicts a flow chart of another method for processing a substrate in accordance with some embodiments of the present disclosure.

Referring now to FIG. 4, a method 400 of performing physical vapor deposition in a reactor chamber on a substrate positioned on a workpiece support underlying an aluminum sputter target. In embodiments, the method 400 includes at 402 maintaining a substrate at a first temperature of 200 to 400 degrees Celsius. In some embodiments, at 404, method 400 includes sputtering atoms from the aluminum sputter target by applying a first DC power of about 4 kW to 60 kW to the aluminum sputter target and a first AC target bias power of at least 600 W. In embodiments the AC target bias power is generated from second RF bias power source 363.

In some embodiments, method 400 includes at 406 maintaining reaction conditions for a duration sufficient to form a first layer of aluminum having a first grain size. For example, in embodiments a first region may be formed including a small grain size or average smaller grain size. In embodiments, a small grain size may be about 1.5 micrometers on average. In some embodiments, a small grain size may be about 1 to 1.6 micrometers on average. In some embodiments, a small grain size may be less than 1.6 micrometers on average.

In some embodiments, method 400 includes at 408 delaying a cooling of substrate for a first duration. In some embodiments, the first duration may be about 5 to 120 seconds, such as 20 seconds, 30 seconds, 40 seconds, and the like. In some embodiments, delaying includes delaying the transfer to the substrate including the first layer of aluminum to a rapid cooling chamber.

In some embodiments, method 400 includes at 410 cooling the first layer of aluminum to a second temperature. In some embodiments, cooling is performed at a rate sufficient to increase the first grain size to a second grain size. In some embodiments, cooling includes delaying the transfer to the substrate including the first layer of aluminum to a rapid cooling chamber. In embodiments the delay in transfer extends the amount of cooling time, and/or controls the cooling in accordance with the present disclosure. In embodiments, cooling lowers the temperature to about 100 degrees Celsius such as a temperature in the amount of 98 degrees Celsius to 102 degrees Celsius. In some embodiments, cooling in accordance with the present disclosure increases the grain size of the as deposited aluminum by 3 to 40 percent, such as 3 to 25 percent, or 3 to 15 percent. In some embodiments, the second grain size is greater than 2.5 micrometer on average, or 2 to 4 micrometers on average.

In some embodiments, the present disclosure provides a method of performing physical vapor deposition in a reactor chamber to form aluminum material on a substrate including depositing a first aluminum layer atop a substrate to form a first aluminum region having a first grain size and a first temperature; and cooling the first aluminum region atop a substrate to a second temperature at a rate sufficient to increase the first grain size to a second grain size. In some embodiments, the methods further include delaying cooling for a first duration. In some embodiments, the first duration is about 5 to 120 seconds. In some embodiments, cooling is performed at a cooling rate of 10 to 40 degrees Celsius per second. In some embodiments, the first temperature is greater than 375 to 450 degrees Celsius and the second temperature is less than 100 degrees Celsius. In some embodiments, depositing a first aluminum layer atop a substrate to form a first aluminum region having a first grain size and a first temperature is performed atop a heated surface, and wherein cooling is performed by moving the substrate away from the heated surface. In some embodiments, cooling the first aluminum region to a second temperature at a rate sufficient to increase the first grain size to a second grain size further comprises delaying a transfer of the first aluminum region atop a substrate to a rapid cooling chamber. In some embodiments, depositing a first aluminum layer is performed at a first DC power in an amount of 4 kW to 60 kW. In some embodiments, the first aluminum layer is deposited by exposing the substrate to aluminum and argon in a physical vapor deposition process. In some embodiments, an aluminum material is formed using a physical vapor deposition process comprising an aluminum target. In some embodiments, cooling the first aluminum region atop a substrate to a second temperature at a rate sufficient to increase the first grain size to a second grain size further comprises increasing a flow of gas adjacent a backside of a substrate to cool the substrate.

In some embodiments, a method of performing physical vapor deposition in a reactor chamber on a substrate positioned on a workpiece support underlying an aluminum sputter target, includes: maintaining a substrate at a first temperature of 200 to 400° C. and a first pressure below 10 mTorr atop a heated workpiece support; sputtering atoms from the aluminum sputter target by applying a first DC power of about 4 kW to 60 kW to the aluminum sputter target and a first AC target bias power of at least 600 W; maintaining reaction conditions for a duration sufficient to form a first layer of aluminum having a first grain size; delaying a cooling of substrate for a first duration; and cooling the first layer of aluminum to a second temperature at a rate sufficient to increase the first grain size to a second grain size. In some embodiments, cooling the first layer of aluminum to a second temperature comprises providing a flow of gas adjacent a backside of a substrate to cool the substrate. In some embodiments, cooling is performed at a cooling rate of 10 to 40 degrees Celsius per second. In some embodiments, delaying cooling further comprises moving the substrate away from the workpiece support. In some embodiments, delaying further comprises moving the substrate away from the workpiece support by contacting the substrate with one or more lift pins. In some embodiments, delaying cooling comprises delaying a transfer of the substrate to a rapid cooling chamber.

Figure 5:
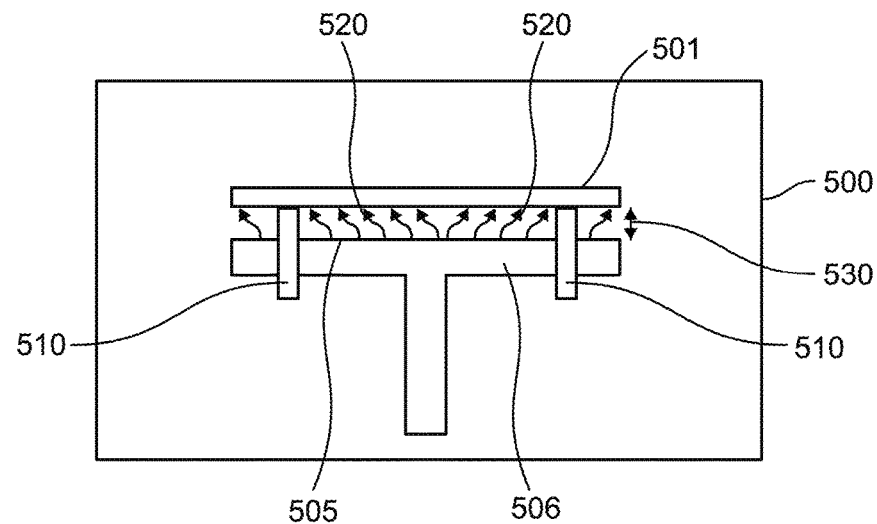
FIG. 5 depicts a schematic, cross-sectional view of a physical vapor deposition (PVD) chamber in accordance with some embodiments of the present disclosure.

Referring now to FIG. 5, a schematic, cross-sectional view of a physical vapor deposition (PVD) chamber 500 in accordance with some embodiments of the present disclosure is shown. In embodiments a wafer or substrate 501 is deposited above a heated surface 505 of an electrostatic chuck 506. In embodiments, the substrate 501 is cooled by moving one or more lift pins 510 to lift the substrate 501 away from the heated surface 505 of the electrostatic chuck 506. Heat irradiating (shown by arrows 520) away from the electrostatic chuck 506 contacts the substrate 501 and cools the substrate in accordance with the present disclosure, in a controlled manner. A gap (shown by arrow 530) is shown between the substrate 501 and heated surface 505 of the electrostatic chuck 506. Gas can flow behind the substrate 501 or wafer further cooling the substrate 501 in a controlled manner in accordance with the present disclosure.

Figure 6:
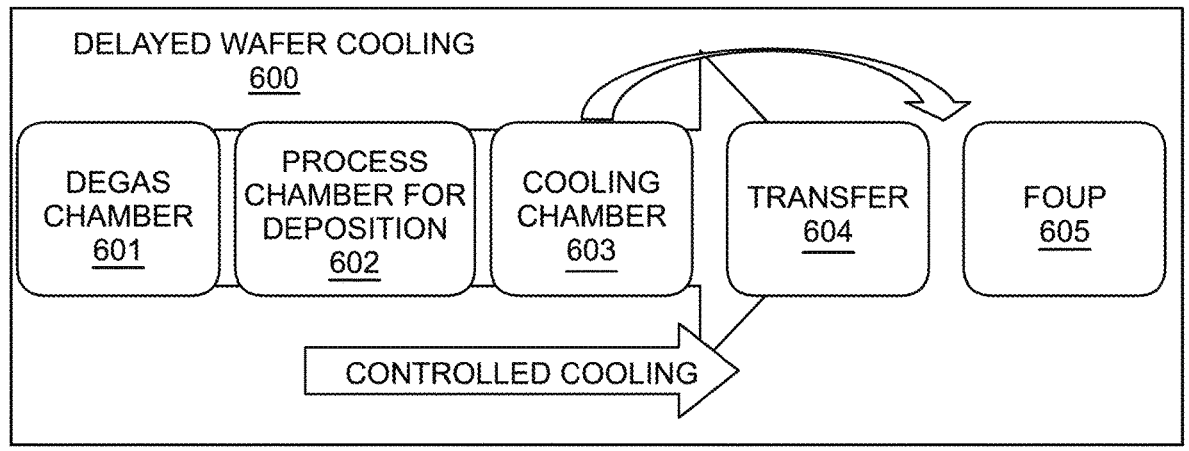
FIG. 6 depicts a flow chart of another method for processing a substrate in accordance with some embodiments of the present disclosure.

FIG. 6 depicts an apparatus configuration and flow chart of another method 600 for processing a substrate in accordance with some embodiments of the present disclosure. In embodiments, the apparatus configuration and method reduce or eliminate aluminum pad abnormality after thermal process that may problematically result in whisker defect formation or hillock defects such as small grain area with more grain boundaries. In embodiments, grain size from center to edge may be problematically small such as 1.4 to 1.5 micrometers in an area greater than 130-150 mm away from the center of the wafer. The inventors have observed that grain size at the edge of a wafer such as 130-150 mm away from the center of the wafer needs to be enlarged to avoid hillock formation after downstream processing.

FIG. 6 shows an apparatus comprising a gas chamber 601, process chamber for deposition 602, cooling chamber 603, transfer chamber 604 and FOUP 605 in a sequence suitable for use in the methods of the present disclosure. In some embodiments, the cooling chamber 603 is moved to a position immediately adjacent the FOUP 605 to facilitate a delayed cool in accordance with the present disclosure. In embodiments, apparatus configured for method 600 includes a delayed cooling of a substrate comprising as deposited aluminum. In embodiments, a substrate in accordance with the present disclosure is sequentially passed through degas chamber 601, process chamber for deposition 602, cooling chamber 603, transfer chamber 604 and FOUP 605. In embodiments, a substrate in accordance with the present disclosure is sequentially passed through degas chamber 601, process chamber for deposition 602, transfer chamber 604, cooling chamber 603, and FOUP 605. In embodiments, the configuration provides a method in accordance with the present disclosure including delaying and/or controlled wafer cooling in accordance with the present disclosure.

In some embodiments, the methods of the present disclosure are applied to process sequences for the deposition of aluminum, wherein the deposition and post-deposition process sequence each promote aluminum grain growth. For example, cooling in accordance with the present disclosure can be combined with aluminum deposition process sequences, wherein the deposition process sequence promotes or forms aluminum with an increased grain size. In one process sequence the methods may include preheating a substrate such as heating the substrate to a temperature of 200 to 400 degrees Celsius, e.g., about 200 degrees Celsius. In embodiments, preheating the substrate may include the use of a pedestal heater to warm up the substrate near the middle of the substrate, along the edge of the substrate, or near the middle and along the edge of the substrate to predetermined temperatures. Depending upon process needs, the middle of the substrate and edge of the substrate may each have a predetermined temperature which may be the same or different. In embodiments, the temperature of the edge of the substrate is 20 to 50 degrees warmer than the center of the substrate. In embodiments, a process sequence may continue by depositing a seed layer of aluminum, wherein the seed layer comprises an evenly distributed grain size across the substrate. For example, in embodiments, plasma energy is utilized to heat up the substrate. In embodiments, the only heat source is plasma and no heat sink is provided. The plasma heating transfers heat evenly within the substrate and evenly heats up the substrate to a preselected temperature. In embodiments, plasma heating in accordance with the present disclosure forms an aluminum layer composition having an even center/edge grain size. In embodiments, the seed layer thickness is preselected to let seed grains at both the center of the substrate and edge of the substrate grow to a mature stage. In some embodiments, a process sequence may continue by a fast growth of aluminum by contacting the substrate with a backside gas and reducing the deposition cool cycle. In some embodiments, a backside gas is directed towards the center of the substrate to cool the wafer center. In some embodiments, a backside gas cools the wafer while avoiding whisker formation, or non-uniform grain growth. In embodiments, the process sequence continues with a cooling process of the present disclosure as described above. Accordingly, the aluminum deposition and the post deposition delay of rapid cooling may extend the aluminum grain growth. In some embodiments, a grain size or average grain size of as deposited aluminum is about 1.5 micrometer which may become larger to 2-4 micrometer, such as 2.0, 2.4, 2.6, 2.8, 3.0. 3.2, and 3.8 micrometer using the process of the present disclosure.

Figure 7:
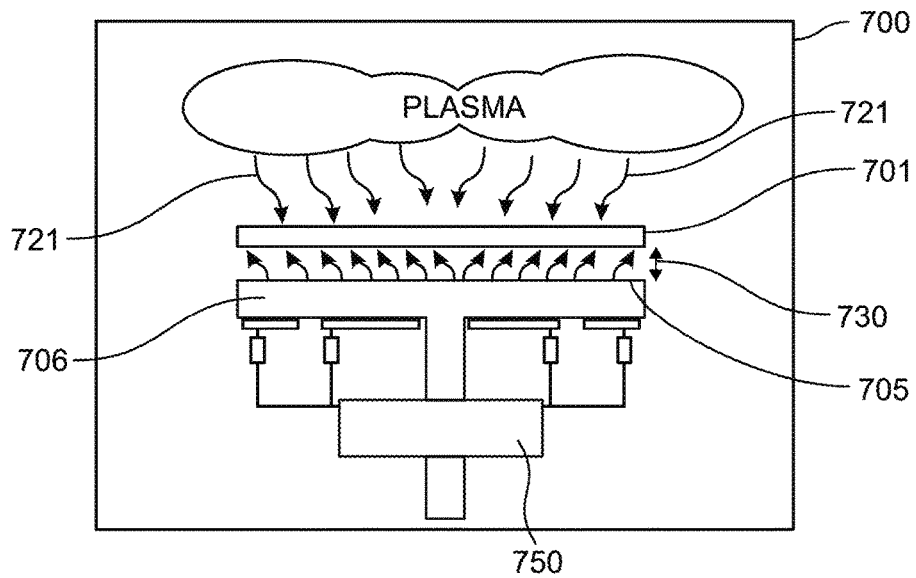
FIG. 7 depicts a schematic, cross-sectional view of a physical vapor deposition (PVD) chamber in accordance with some embodiments of the present disclosure.

Referring now to FIG. 7, a schematic, cross-sectional view of a physical vapor deposition (PVD) chamber 700 in accordance with some embodiments of the present disclosure is shown. In embodiments a wafer or substrate 701 is deposited above a surface 705 of an electrostatic chuck 706. In embodiments, the substrate 701 is configured for depositing aluminum in accordance with embodiments of the present disclosure. Plasma (shown by arrows 721) contacts the substrate 701 and heats the substrate in accordance with the present disclosure, in a controlled manner. A gap (shown by arrow 730) is shown between the substrate 701 and surface 705 of the electrostatic chuck 706. Gas can flow behind the substrate 701 or wafer further cooling the substrate 701 in a controlled manner in accordance with the present disclosure. In embodiments, a dual zone heater 750 is provided and configured to heat the substrate to a predetermined temperature for aluminum deposition. In embodiments, dual zone heater 750 is configured to heat the outside edge of the substrate to a predetermined temperature which may be the same or different than a predetermined temperature of the center of the substrate.

Figure 8:
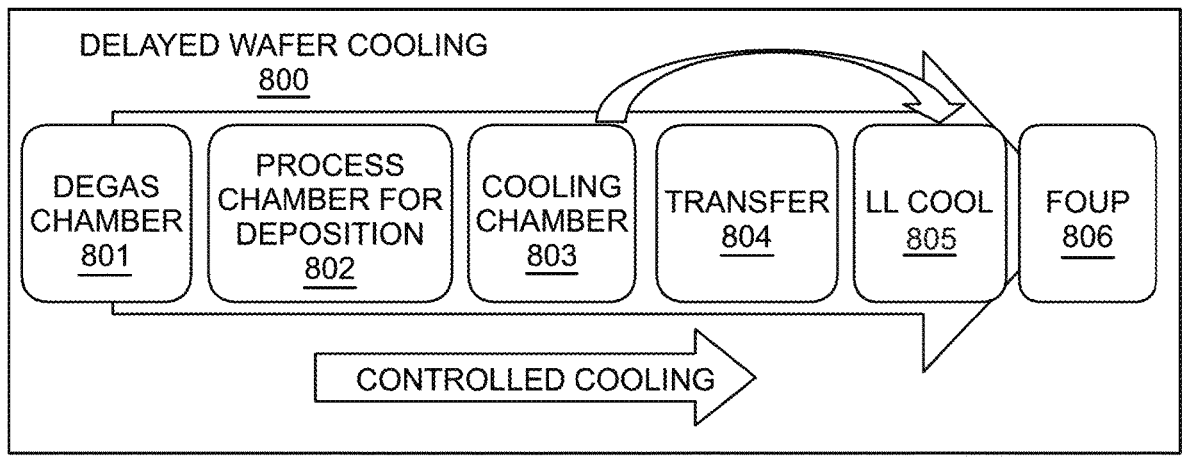
FIG. 8 depicts a flow chart of another method for processing a substrate in accordance with some embodiments of the present disclosure.

FIG. 8 depicts a flow chart of another method 800 for processing a substrate in accordance with some embodiments of the present disclosure. FIG. 8 shows a degas chamber 801, process chamber for deposition 802, cooling chamber 803, transfer chamber 804, cooling chamber 805 and FOUP 806 in a sequence suitable for use in the methods of the present disclosure. In some embodiments, the cooling chamber 803 is moved to a position immediately adjacent the FOUP 806 to facilitate a delayed cool in accordance with the present disclosure. In embodiments, method 800 includes a delayed cooling of a substrate comprising as deposited aluminum. In embodiments, method 800 is suitable for maximizing aluminum grain size and allowing grain boundary relaxation to avoid hillock formation.

In some embodiments, the present disclosure relates to a method of performing physical vapor deposition in a reactor chamber on a substrate positioned on a workpiece support underlying an aluminum sputter target, the method including: optionally preheating a substrate to a first temperature; contacting a substrate with plasma in an amount sufficient to maintain a substrate at the first temperature of 200 to 400° C., sputtering atoms from the aluminum sputter target by applying a first DC power of about 20 kW to 60 kW to the aluminum sputter target to form a first seed layer of aluminum with an evenly distributed grain size; contacting the substrate with a backside gas to cool the substrate while depositing aluminum to a predetermined thickness; and cooling the aluminum atop a substrate to a second temperature to increase the first grain size to a second grain size. In embodiments, the method is suitable for avoiding randomized grain orientation and avoiding aluminum pad abnormalities. In embodiments, the plasma provides energy for grain growth during deposition and the cooling in accordance with the present disclosure or delayed rapid cooling enhances grain growth post-deposition. In embodiments, after deposition, energy is allowed to equalize through the substrate to reduce center/edge grain size changes and allowing for grain boundary relaxation for example by slow cool method.

While the foregoing is directed to embodiments of the present disclosure, other and further embodiments of the disclosure may be devised without departing from the basic scope thereof.

The invention claimed is:

1. A method of performing physical vapor deposition in a reactor chamber to form an aluminum layer on a substrate comprising:
depositing the aluminum layer atop the substrate to form a first aluminum region having a first grain size and a first temperature; and
cooling the first aluminum region atop the substrate in a process gas consisting of one or more inert gases to a second temperature at a rate sufficient to increase the first grain size to a second grain size.

2. The method of claim 1, further comprising delaying cooling for a first duration.

3. The method of claim 2, wherein the first duration is about 5 to 120 seconds.

4. The method of claim 1, wherein cooling is performed at a cooling rate of 20 to 40 degrees Celsius per second.

5. The method of claim 1, wherein the first temperature is about 375 to 450 degrees Celsius and the second temperature is less than 100 degrees Celsius.

6. The method of claim 1, wherein depositing the aluminum layer atop the substrate to form a first aluminum region having a first grain size and a first temperature is performed atop a heated surface, and wherein cooling is performed by moving the substrate away from the heated surface.

7. The method of claim 1, wherein cooling the first aluminum region to a second temperature at a rate sufficient to increase the first grain size to a second grain size further comprises delaying a transfer of the first aluminum region atop the substrate to a rapid cooling chamber.

8. The method of claim 1, wherein depositing the aluminum layer is performed at a first DC power in an amount of 4 kW to 60 kW.

9. The method of claim 1, wherein the aluminum layer is deposited by exposing the substrate to aluminum and argon in a physical vapor deposition process.

10. The method of claim 1, wherein cooling the first aluminum region atop the substrate to a second temperature at a rate sufficient to increase the first grain size to a second grain size further comprises increasing a flow of gas adjacent a backside of the substrate to cool the substrate.

11. The method of claim 1, wherein the aluminum layer comprises an aluminum alloy comprising other metals in an amount of less than about 1% weight of the total weight of the aluminum layer.

12. A method of performing physical vapor deposition in a reactor chamber on a substrate positioned on a workpiece support underlying an aluminum sputter target, the method comprising:
maintaining the substrate at a first temperature of 200 to 400° C. and a first pressure below 10 mTorr atop a heated workpiece support;
sputtering atoms from the aluminum sputter target by applying a first DC power of about 4 kW to 60 kW to the aluminum sputter target and a first AC target bias power of at least 600 W;
maintaining reaction conditions for a duration sufficient to form a first layer of aluminum having a first grain size;
delaying a cooling of the substrate for a first duration; and
cooling the first layer of aluminum in a process gas consisting of one or more inert gases to a second temperature at a rate sufficient to increase the first grain size to a second grain size.

13. The method of claim 12, wherein cooling the first layer of aluminum to a second temperature comprises providing a flow of gas adjacent a backside of the substrate to cool the substrate.

14. The method of claim 12, wherein cooling is performed at a cooling rate of 10 to 40 degrees Celsius per second.

15. The method of claim 12, wherein delaying further comprises moving the substrate away from the workpiece support.

16. The method of claim 15, wherein delaying further comprises moving the substrate away from the workpiece support by contacting the substrate with one or more lift pins.

17. The method of claim 12, wherein delaying comprises delaying a transfer of the substrate to a rapid cooling chamber.

18. A physical vapor depositing chamber, comprising:
a reaction chamber configured for physical vapor depositing a first aluminum layer atop a substrate to form a first aluminum region having a first grain size and a first temperature;

and cooling the first aluminum region atop the substrate in a process gas consisting of one or more inert gases to a second temperature at a rate sufficient to increase the first grain size to a second grain size, wherein the reaction chamber is configured to provide a flow of gas adjacent a backside of the substrate to cool the substrate, and wherein cooling is performed by moving the substrate away from a heated surface.

* * * * *